United States Patent
Viti

(10) Patent No.: US 6,177,796 B1
(45) Date of Patent: Jan. 23, 2001

(54) RADIO FREQUENCY SIGNAL RECEIVING UNIT, PARTICULARLY FOR NUCLEAR MAGNETIC RESONANCE IMAGING MACHINES

(75) Inventor: Vittorio Viti, Arenzano (IT)

(73) Assignee: Esaote S.p.A., Monferrato (A.L.) (IT)

( * ) Notice: Under 35 U.S.C. 154(b), the term of this patent shall be extended for 0 days.

(21) Appl. No.: 09/349,716

(22) Filed: Jul. 8, 1999

(30) Foreign Application Priority Data

Jul. 9, 1998 (IT) .............................................. SV98A0042

(51) Int. Cl.[7] .................................................... G01V 3/00
(52) U.S. Cl. ............................................ 324/314; 324/309
(58) Field of Search ................................. 324/314, 309, 324/318

(56) References Cited

U.S. PATENT DOCUMENTS

| | | | |
|---|---|---|---|
| 3,852,678 | * 12/1974 | Frye | 330/15 |
| 4,792,760 | 12/1988 | Jacob et al. | 324/322 |
| 4,793,356 | * 12/1988 | Misic et al. | 128/653 |
| 4,823,220 | * 4/1989 | Milstar et al. | 369/13 |
| 4,839,594 | 6/1989 | Misic et al. | 324/318 |
| 5,051,700 | 9/1991 | Fox | 324/322 |

FOREIGN PATENT DOCUMENTS

| 0 468 857 | 1/1992 | (EP) . |
|---|---|---|
| 0971239 | * 1/2000 | (EP) . |

OTHER PUBLICATIONS

Society of Magnetic Resonance In Medicine; Book of Abstracts; vol. 2; Aug. 1998; 2 pages.

* cited by examiner

*Primary Examiner*—Jay Patidar
*Assistant Examiner*—Brij B. Shrivastav
(74) *Attorney, Agent, or Firm*—Burns, Doane, Swecker & Mathis, L.L.P.

(57) ABSTRACT

A radio-frequency signal receiving unit, particularly for Nuclear Magnetic Resonance imaging machines, including a signal receiving coil (1), whose outputs (101, 201) are connected to a signal amplifier (2). The coil (1) is in balanced connection with the signal amplifier (2), i.e. connected thereto in such a manner that none of its two outputs (101, 201) is permanently connected to the ground. A particular kind of balanced amplifier is suggested to which the balanced outputs (101, 201) of the coil are connected through balanced means for optimizing the Noise Figure of the amplifier (3).

9 Claims, 3 Drawing Sheets

RADIO FREQUENCY SIGNAL RECEIVING UNIT, PARTICULARLY FOR NUCLEAR MAGNETIC RESONANCE IMAGING MACHINES

BACKGROUND OF THE INVENTION

The invention relates to a radio-frequency signal receiving unit particularly for Nuclear Magnetic Resonance imaging machines, comprising:

a) a signal receiving coil (1), whose outputs (101, 201) are connected to a signal amplifier (2)

b) the coil (1) being in balanced connection with the signal amplifier (2), i.e. connected thereto in such a manner that none of its two outputs (101, 201) is permanently connected to the ground;

c) passive balancing means (4), the amplifier (2) being interposed between the coil outputs and the said passive balancing means (4);

d) the signal amplifier (2) comprising at least two active amplifying devices (3), each associated to an input to which one of the outputs (101, 201) of the coil is connected, e) active amplifying devices (3) having an output connected to a device for recombining useful signals and canceling out undesired signals, that is a device which is able to add signals in phase opposition and to cancel signals in phase from inputs.

In Nuclear Magnetic Resonance imaging machines and especially in "dedicated" machines, i.e. designed to detect images of individual parts of the body, the problem of effectively removing noise from the detected signal is particularly significant.

The mostly magnetic radio-frequency signal reemitted from the patient body is relatively feeble and combines with mostly electric noise components introduced by the body directly inside the detection volume: therefore, this noise must be canceled from the signal, which is also affected by thermal noise, so that is can be further amplified and that the data thereof can be correctly processed to reconstruct the image.

A well-known and effective solution to the problem of electromagnetic noise on the signals received by a receiving coil consists in using a Faraday cage, which is assembled in such a way as to enclose and contain the whole machine and the patient inside it, in order to provide effective shielding of the detected electromagnetic signals.

This choice certainly provides a solution to the problem of electromagnetic noise removal.

Nevertheless, the relatively big shape and size of a structure of this type make its construction particularly expensive and difficult, and anyway requiring plenty of time; the use of the machine would be more complex for the personnel and, further, if the machine is not properly integrated into an appropriate environment, it may induce a certain emotional impact on the patient and be psychologically unattractive.

A further solution consists in placing the patient body on the ground, while closing the apertures for entering and introducing the part of the body in the machine volume dedicated to Nuclear Magnetic Resonance imaging.

In this case, noise may be removed thanks to ground connection, since a specific path is provided for the noise signals picked up by the patient body: however, even this solution is not effective enough to satisfactorily remove the noise.

The electrical connection of the patient to the ground is relatively difficult due both to the anatomic structure and to the low conductivity of the human body.

In any case, the ideal ground connection conditions cannot be easily attained and a certain part of noise is equally transmitted inside the detection cavity.

Document U.S. Pat. No. 4,839,594 discloses a radio-frequency signal receiving unit showing the combination of features a) to e) listed above. The arrangement of U.S. Pat. No. 4,839,594 solves the problem of suppressing the electrically induced noise by the patient body. Nevertheless the amplifier introduces thermal noise, which amount is currently quantified by the so called Noise Figure. This thermal noise limits the overall signal to noise ratio that can be achieved by the system reducing the advantages aimed by the balanced coil configuration.

SUMMARY OF THE INVENTION

The invention aims to provide a balanced coil configuration as described above and according to the configuration of features a) to e), which is built in such a way to improve the overall signal to noise ratio, minimizing the noise Figure of the balanced amplifier.

The invention achieves the above mentioned goal by providing a balanced coil configuration showing in combination with the above listed features a) to e) the further feature f) consisting in the fact that the outputs of the receiving coil are connected to the inputs of the amplifier through balanced means for optimization of the noise figure of the amplifier.

The invention achieves the above objects by providing a unit of the type described herein in which the receiving coil is in balanced connection with the signal amplifier, i.e. connected thereto in such a way that none of its two outputs is permanently connected to the ground.

According to an advantageous embodiment the means for optimization of the amplifier noise figure are balanced impedance matching means of the coil.

Preferably the balanced impedance matching means are symmetric capacitive transformer or symmetric inductive transformer.

The signal amplifier has the further characteristic that it provides a signal power amplification with little added noise.

According to a further improvement, the signal amplifier to be used may be of the so-called "push-pull" very low-noise type.

A "push-pull" amplifier that may be used in this case consists of a circuit including at least two active amplifying devices, each associated to an input, and connected at their output to a device for recombining useful signals and canceling out undesired signals, that is a device which is able to add signals in phase opposition and to cancel signals in phase from inputs.

Circuits including at least two or more transistors, field effect transistors, or other active components in a particular differential configuration, connected to different passive components may be used as an active amplifier.

A transformer placed at the output of the circuit or a resonant section of transmission line or an operational amplifier say be provided as a device for recombining output signals from the at least two active amplifiers.

Said transformer having the function o a device for recombining signals from the two inputs after amplification acts as a passive "balun" after the first balanced amplification stage, thereby ensuring that the noise added to the signal has a very low power.

The secondary winding of the transformer is connected by one end to the ground and by the other end to the following signal amplifying and/or processing stages, usually all in non-balanced connection with respect to the ground potential.

The signal amplifier in use is miniaturized and/or on printed circuit or also in the form of a so-called "hybrid", a circuit integration technology which is intermediate between miniaturized circuits and integrated circuits, and is mounted directly on the case or on the coating or on the supporting means and/or at the outputs of the receiving coil, as close as possible thereto; these arrangements are also necessary to improve the balanced connection condition of the coil.

By not using long connecting conductors and the associated impedance transformers, most problems of signal-to-noise ratio worsening are prevented.

The advantages of this combination consist in a relatively low cost of the amplifier, in a very easy implementation and use of the whole circuit, in an effective suppression of the noise introduced by the body, which is fast and safe since it occurs in the amplification stage and at least in the maintenance, and even improvement of the noise figure, which is comparable with the one obtained with the best currently available systems, i.e. in the attainment of an excellent signal-to-noise ratio.

The unit according to the invention is particularly effective in suppressing noise introduced, through the patient body, inside the volume dedicated to signal reception, thanks to the acknowledgement that the noise introduced by the body is mainly electric, hence most of the noise may be simply removed by using a combination based on an amplifier with differential inputs and on a receiving coil having balanced and matched outputs as provided by the invention.

BRIEF DESCRIPTION OF THE DRAWINGS

The characteristics of the invention and the advantages derived therefrom will appear more clearly from the following description of the accompanying drawings, in which.

DETAILED DESCRIPTION

Figure 1:
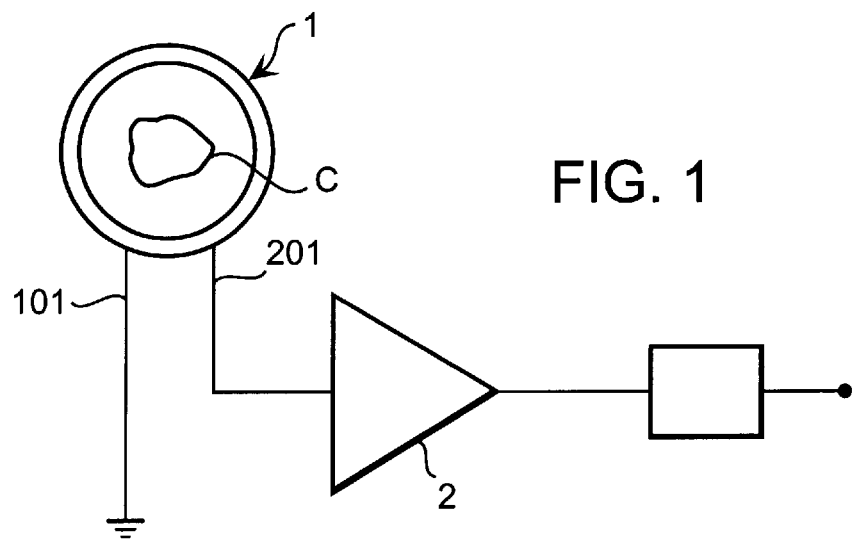
FIG. 1 is a simplified schematic view of a receiving coil in a non-balanced connection with a general-purpose non differential signal amplifier, according to the state of the art.

With reference to FIG. 1, a traditional radio-frequency signal receiving coil 1 is in unbalanced connection with a general-purpose non-differential signal amplifier 2, so that a first end thereof 101 is permanently connected to the ground, and that a second end thereof 201 is connected to the input of a signal amplifier 2.

As referred to the context of a Nuclear Magnetic Resonance imaging machine, the output 201 of the receiving coil 1 carries the signal detected from the body C directly to the signal amplifier 2.

The body C inside the coil 1, when subject to an electric potential change, caused by mainly electric noise, determines a potential change at the leads of the receiving coil 1 and, as a consequence, the input signal of the amplifier 2 changes its potential according to the variations induced by the body C.

The signal, which is partially made of noise, is then amplified and the information carried thereby passes through the following amplifying and processing stages.

Figure 2:
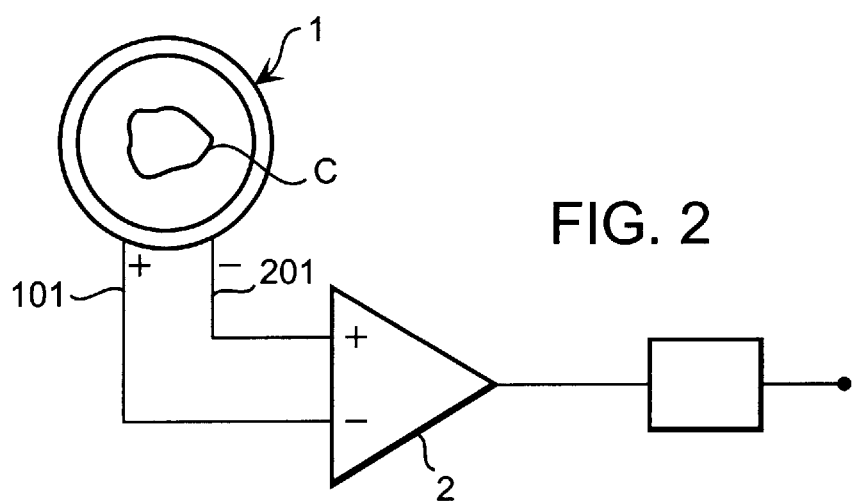
FIG. 2 is a simplified schematic view of a receiving coil in a balanced connection with a differential signal amplifier.

Referring to FIG. 2, the receiving unit according to the invention comprises a receiving coil 1, which encloses a part of the patient body C inside it, which coil 1 has both outputs 101, 201 connected to one input of a differential operational amplifier 2 respectively.

In this case, the electric potential changes induced by the body C are mostly compensated by the operation of the differential amplifier 2, which acts on the difference between two useful input signals, in phase opposition, and amplifies them.

Thanks to this operation, and to the combination with the balanced receiving coil 1, the differential amplifier 2 ensures that the noise introduced by the body C and present, in substantially equal extent and phase on both outputs 101, 201 of the coil 1, are removed, whereby said noise does not contribute to the output signal of the amplifier 2.

In NMR applications, signal amplification must minimize the noise power introduced, which characteristic can be also found in more traditional unbalanced amplifiers. However, this minimized noise characteristic cannot be found in the balanced configuration and in currently available operational amplifiers, anyway not as much as a NMR system requires.

According to a further improvement, he signal amplifier 2 may be of a low noise and balanced type, and more specifically of the so called "push-pull" type.

Figure 3:
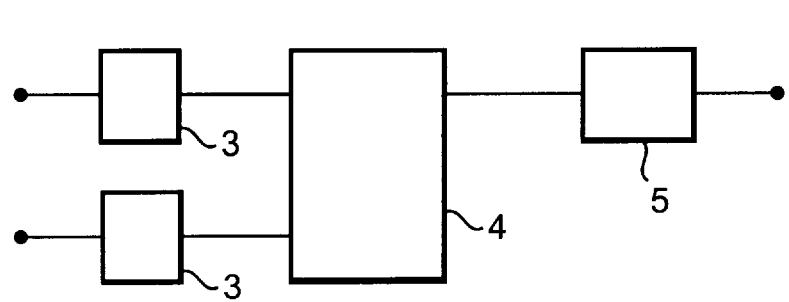
FIG. 3 is a block diagram of a general-purpose "push-pull" amplifier particularly fit for the present invention.

FIG. 3 shows a block diagram of a general-purpose "push-pull" amplifier. At least one active amplifying device 3 is provided on each input of the amplifier. Said active amplifying devices 3 are connected in a differential configuration, with balanced inputs against the ground potential. The outputs of the at least two active amplifying devices 3 are connected to the inputs of a recombining device 4, also balanced with respect to ground potential, whose output is in traditional unbalanced connection with the following processing stages, schematically indicated as 5.

The "push-pull" amplifier according to this improvement provides power addition of the useful part of the signals, i.e. for the NMR signals in phase opposition, and a power difference for the undesired part, that is for radio-frequency noise signals, which are in phase with each other.

The active amplifying devices 3 may be of any suitable type, such as transistors, field effect transistors, or similar. The device for recombining the useful signal and for canceling out the noise signal may also be of any type, such as a transformer, a resonant section of transmission line or an active device, for example an operational amplifier.

Figure 4:
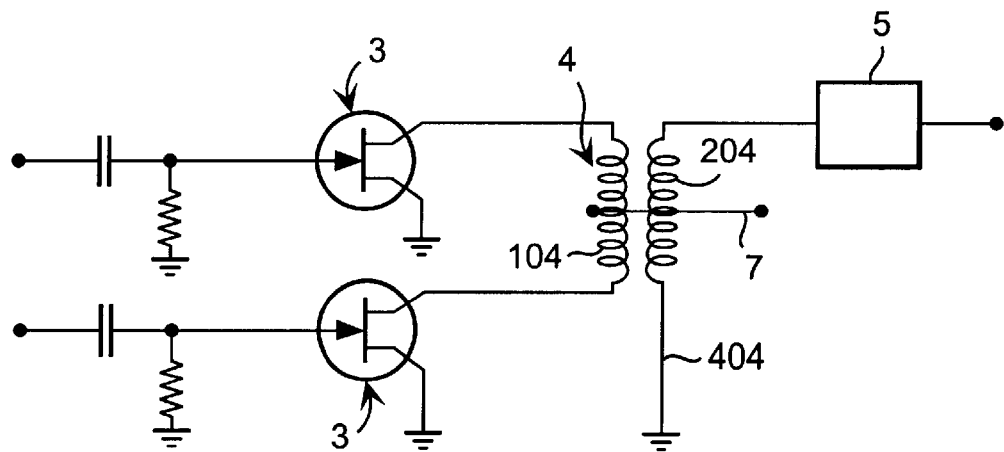
FIG. 4 is a circuit diagram of a specific push-pull amplifier as shown in FIG. 3, in its simplest and most inexpensive configuration.

FIG. 4 shows a "push-pull" amplifier in a simpler circuit configuration. In this example the active amplifying devices 3 are J-FET, whereas the device for recombining the useful signal and for canceling out the noise is a transformer 4.

The primary of the transformer 4 is radio-frequency balanced with respect to ground potential, since its primary winding 104 is symmetrical and connected, through an intermediate outlet 7, to a supply terminal. The secondary winding 204 of the transformer 4 is connected by one end 304 to the ground and by the other end 404 to the following unbalanced signal amplifying and/or processing stages.

Said following stages are not shown in detail, since they are known per se and may be all in unbalanced connection with respect to the ground potential.

A further characteristic, though not shown, is that, in this case, to maintain balanced input connections as constant as possible, and to avoid further signal unbalancing, the differential amplifier 2 is miniaturized and/or on a printed circuit and is mounted preferably directly on the receiving coil 1, or on the supporting means or on the case or in the outputs 101, 201 thereof. The construction of the amplifier 2 may be also of the so-called "hybrid" type, i.e. using a technique which provides partial integration of components.

Figure 5:
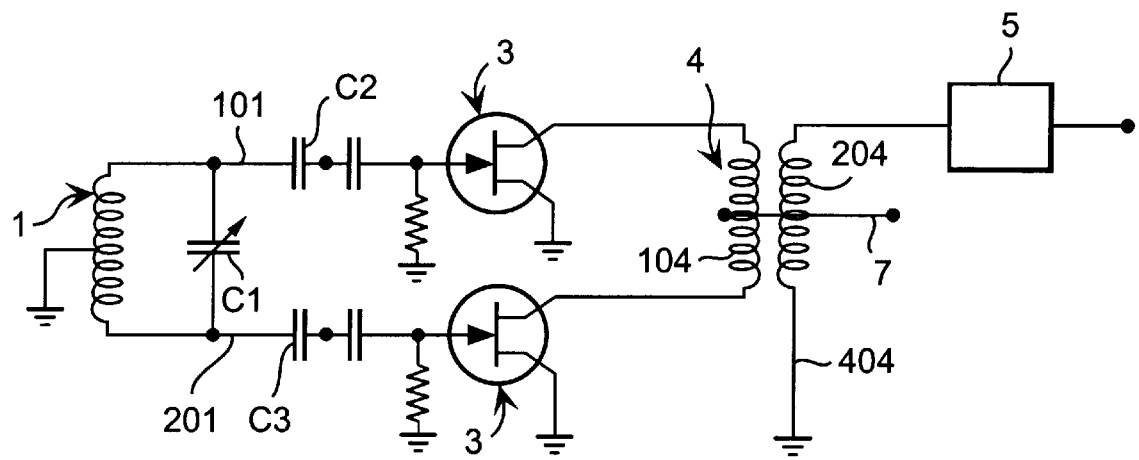
FIGS. 5 and 6 show a circuit diagram with an amplifier according to FIG. 4 to which respectively two kinds of balanced coils are connected, which are particularly fit to be used in the unit according to the invention and having capacitive balanced impedance matching transformers.
Figure 6:
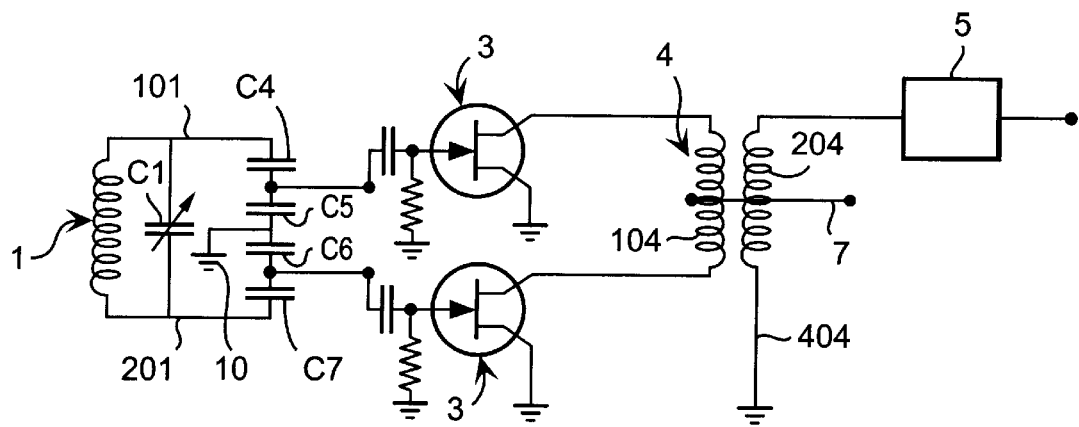

FIGS. 5 and 6 show the above described push-pull amplifier according to FIG. 4 to which a balanced coil is connected through means for optimizing the noise figure of the amplifier.

According to FIG. 5, the receiving coil is a balanced coil with a first kind of capacitive, balanced transformer for impedance matching. A tuning capacitor C1 connects the two outputs 101, 201 of coil 1. Two matching capacitors C2, C3 are fitted serially between one corresponding output 101, 201 of the coil 1 and the relating input of the amplifier.

According to FIG. 6, the capacitive, balanced transformer is connected in parallel to the tuning capacitor C1 between the two outputs of the coil 1. The transformer comprises four matching capacitors C4, C5, C6, C7 grounded in a balanced way at 10. The two outputs to the amplifier are derived symmetrically and in an balanced way from between capacitors C4 and C5 and from between capacitors C6 and C7.

Figure 7:
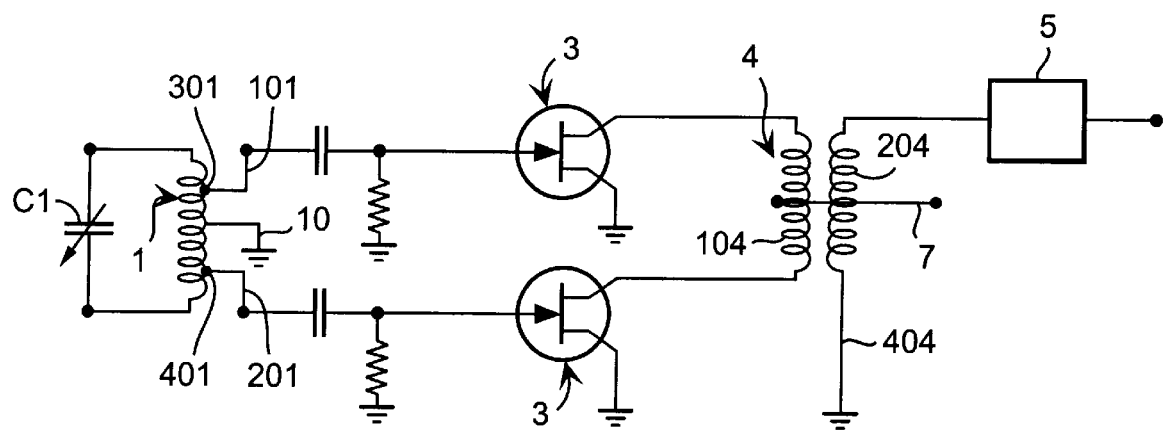
FIG. 7 is a circuit diagram according to FIGS. 5 and 6 and in which the balanced impedance matching transformer is of the inductive type.

The circuit diagram of FIG. 7 shows the amplifier according to FIG. 4 to which a balanced coil 1 is connected through a balanced inductive transformer. Again in parallel to the coil 1 there is connected a tuning capacitor C1. On the coil 1 two balanced taps 301, 401 are provided from which the two outputs 101, 201 are derived.

The invention is not restricted to the embodiments suggested, described, or shown herein, but may be greatly varied as regards combinations and particular types of components, without departure from the scope disclosed above and claimed below.

What is claimed is:

1. A radio-frequency signal receiving unit, particularly for Nuclear Magnetic Resonance imaging machines, comprising:

a) a signal receiving coil, having outputs connected to a signal amplifier;

b) the signal receiving coil being in balanced connection with the signal amplifier wherein none of said outputs are permanently connected to ground;

c) a passive balancing means, wherein the signal amplifier is interposed between the signal receiving coil outputs and the passive balancing means;

d) the signal amplifier comprising at least two active amplifying devices, each having an input to which one of the outputs of the signal receiving coil is connected, e) each of said active amplifying devices having an output connected to a recombining/canceling device for recombining useful signals and canceling out undesired signals wherein said recombining/canceling device is able to add signals in phase opposition and to cancel signals in phase from said inputs; and f) the outputs of the signal receiving coil are connected to the inputs of the signal amplifier through a balanced means for optimization of a noise figure of the signal amplifier.

2. A signal receiving unit as claimed in claim 1, wherein the balanced means for optimization of the signal amplifier noise figure is a balanced impedance matching means of the signal receiving coil.

3. A signal receiving unit as claimed in claim 2, wherein the balanced impedance matching means is a symmetric capacitive transformer or a symmetric inductive transformer.

4. A signal receiving unit as claimed in claim 1, wherein the signal amplifier connected to the signal receiving coil is a very low-noise signal amplifier of the "push-pull" type.

5. A signal receiving unit as claimed in claim 4, wherein the active amplifying devices are components such as two or more transistors, field effect transistors, or other active components which can provide similar functions.

6. A signal receiving unit as claimed in claim 1, wherein the recombining/canceling device is a transformer placed at the outputs of said amplifying devices, or a resonant section of transmission line, or an operational amplifier.

7. A signal receiving unit as claimed in claim 1, wherein said recombining/canceling device is a transformer and wherein said passive balancing means is a primary winding of said transformer balanced with respect to ground or supply potential.

8. A signal receiving unit as claimed in claim 7, wherein the transformer has a secondary winding which is connected by one end to ground and by another end to subsequent signal amplifying and/or processing stages, which are not balanced against the ground potential.

9. A signal receiving unit as claimed in claim 1 wherein the signal amplifier is miniaturized and/or provided on a printed circuit and/or made with the technique for constructing "hybrid" circuits, and is mounted directly on a case or on a supporting means or at the outputs of the signal receiving coil, particularly as close as possible thereto.

* * * * *